United States Patent
Jin et al.

(10) Patent No.: US 7,427,552 B2
(45) Date of Patent: Sep. 23, 2008

(54) METHOD FOR FABRICATING ISOLATION STRUCTURES FOR FLASH MEMORY SEMICONDUCTOR DEVICES

(75) Inventors: Da Jin, Shanghai (CN); Shu Shu Tang, Shanghai (CN); Zuo Ya Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 90 days.

(21) Appl. No.: 11/556,131

(22) Filed: Nov. 2, 2006

(65) Prior Publication Data

US 2007/0128804 A1 Jun. 7, 2007

(30) Foreign Application Priority Data

Dec. 5, 2005 (CN) .......................... 200510111386

(51) Int. Cl.
*H01L 21/76* (2006.01)
(52) U.S. Cl. ................. 438/424; 257/E21.683
(58) Field of Classification Search ......... 438/257–259, 438/294, 424, 700; 257/E21.683, E21.678, 257/E21.209, E21.655
See application file for complete search history.

(56) References Cited

U.S. PATENT DOCUMENTS

| | | | |
|---|---|---|---|
| 6,995,095 B2 * | 2/2006 | Yu | 438/750 |
| 7,211,498 B2 * | 5/2007 | Kim | 438/427 |
| 2002/0045303 A1 * | 4/2002 | Lee | 438/201 |
| 2007/0001214 A1 * | 1/2007 | Park | 257/315 |

* cited by examiner

*Primary Examiner*—Scott B. Geyer
*Assistant Examiner*—Mohsen Ahmadi
(74) *Attorney, Agent, or Firm*—Townsend and Townsend and Crew LLP

(57) ABSTRACT

A method for fabricating integrated circuit devices, e.g., Flash memory devices, embedded Flash memory devices. The method includes providing a semiconductor substrate, e.g., silicon, silicon on insulator, epitaxial silicon. In a specific embodiment, the semiconductor substrate has a peripheral region and a cell region. The method includes forming a first dielectric layer (e.g., silicon dioxide) having a first thickness overlying a cell region and a second dielectric layer (e.g., silicon dixode) having a second thickness overlying the peripheral region. In a specific embodiment, the cell region is for Flash memory devices and/or other like structures. The method forms a pad oxide layer overlying the first dielectric layer and forms a nitride layer overlying the pad oxide layer. The method includes patterning at least the nitride layer to expose a first trench region in the peripheral region and to expose a second trench region in the cell region, while a portion of the first dielectric layer having the first thickness in the cell region is maintained. The method includes forming a first trench structure having a first depth in the first trench region, while the portion of the first dielectric layer having the first thickness in the cell region protects the second trench region. The method includes removing the portion of the first dielectric layer to expose the second trench region. In a specific embodiment, the method includes subjecting the first trench region, including the first trench structure, and the second trench region with an etching process to continue to form the first trench structure from the first depth to a second depth and to form a second trench structure having a third depth within the second trench region. In the third depth is less than the second depth.

12 Claims, 5 Drawing Sheets

Post Step 16

Post Step 17

METHOD FOR FABRICATING ISOLATION STRUCTURES FOR FLASH MEMORY SEMICONDUCTOR DEVICES

CROSS-REFERENCES TO RELATED APPLICATIONS

This application claims priority to Chinese Application No. 200510111386.4; filed on Dec. 5, 2005; commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structure for manufacturing isolation structures for memory devices. Merely by way of example, the invention has been applied to the manufacture of Flash memory devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of isolation structures between the MOS devices. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structure for manufacturing isolation structures for memory devices. Merely by way of example, the invention has been applied to the manufacture of Flash memory devices. But it would be recognized that the invention has a much broader range of applicability.

In a specific embodiment, the present invention provides a method for fabricating integrated circuit devices, e.g., Flash memory devices, embedded Flash memory devices. The method includes providing a semiconductor substrate, e.g., silicon, silicon on insulator, epitaxial silicon. In a specific embodiment, the semiconductor substrate has a peripheral region and a cell region. The method includes forming a first dielectric layer (e.g., silicon dioxide) having a first thickness overlying a cell region and a second dielectric layer (e.g., silicon dioxide) having a second thickness overlying the peripheral region. In a specific embodiment, the cell region is for Flash memory devices and/or other like structures. The method forms a pad oxide layer overlying the first dielectric layer and forms a nitride layer overlying the pad oxide layer. The method includes patterning at least the nitride layer to expose a first trench region in the peripheral region and to expose a second trench region in the cell region, while a portion of the first dielectric layer having the first thickness in the cell region is maintained. The method includes forming a first trench structure having a first depth in the first trench region, while the portion of the first dielectric layer having the first thickness in the cell region protects the second trench region. The method includes removing the portion of the first dielectric layer to expose the second trench region. In a specific embodiment, the method includes subjecting the first trench region, including the first trench structure, and the second trench region with an etching process to continue to form the first trench structure from the first depth to a second depth and to form a second trench structure having a third depth within the second trench region. In the third depth is less than the second depth.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less for high density Flash devices. In a preferred embodiment, we are able to form dual STI trench depth with no additional reticle or masking steps required for a Flash memory process. This method will gain advantages of having shallower trench depth in cell array at minimum cost. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
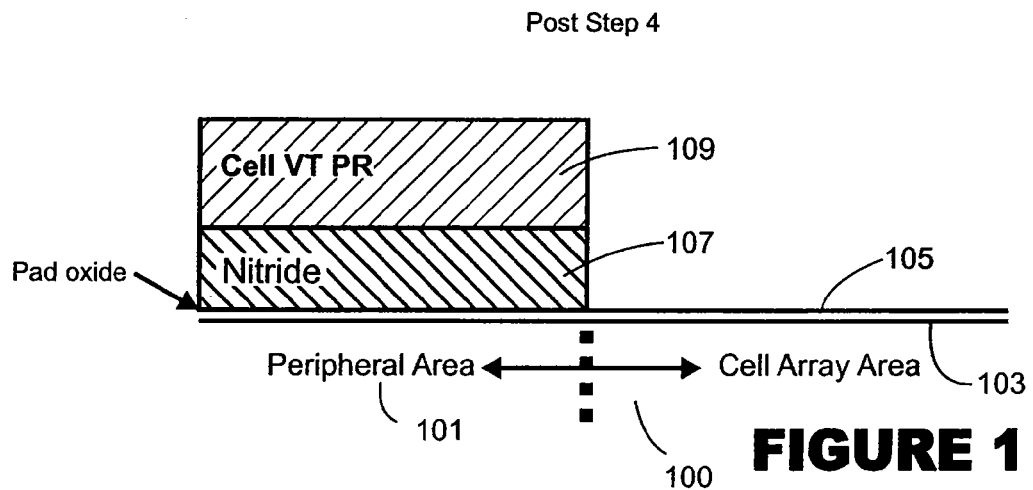
FIGS. 1 through 9 are simplified diagrams of a method for fabricating a Flash memory device according to an embodiment of the present invention.

According to the present invention, techniques for processing integrated circuits for the manufacture of semiconductor devices are provided. More particularly, the invention provides a method and structure for manufacturing isolation structures for memory devices. Merely by way of example, the invention has been applied to the manufacture of Flash memory devices. But it would be recognized that the invention has a much broader range of applicability.

Self aligned source (SAS) is widely used in ETOX type Flash Memory processes in order to reduce the cell size along bit-line direction. At the same time, it is often required to have low source line resistance in order to minimize the unwanted voltage drops along the source line. Isolation pitch, trench depth and source junction profiles are the key factors to determine the source line resistance. As process feature shrinks, deeper trench (~3500 Angstroms) is widely adopted in standard logic processes in order to meet the stringent isolation requirement. This negatively impact the source line resistance by not only effectively increases the total length of source line, but also introduces difficulty to dope the sidewall of the trench. It is therefore suggested to implement dual trench scheme, i.e., two different trench depth with shallower trench in Flash cell array and deeper trench in peripheral circuit. Further details of the present invention can be found throughout the present specification and more particularly below.

A method for fabricating a Flash memory according to an embodiment of the present invention can be outlines briefly as follows:

1. Provide silicon substrate;
2. Grow a layer of pad oxide (~100 Angstrons) on entire silicon substrate;
3. Deposit a layer of nitride (~1500 Angstroms);
4. Apply photo resist and do exposure with cell Vt mask;
5. Etch away the nitride opened by cell Vt mask and do Cell Vt implant;
6. Remove the photo resist and strip away the remaining pad oxide in the opened area;
7. Grow a layer of thick sacrificial oxide (~500 Angstroms) in the opened area, while other area are protected by the nitride;
8. Remove the remaining nitride and pad oxide layer to make the surface of the silicon outside the cell array to be at same level as the oxide surface inside the cell array;
9. Grow a layer of pad oxide (~100 Angstroms) again followed by depositing a layer of nitride (~1500 Angstroms);
10. Apply photo resist (with suitable anti-reflective coating if necessary) and provide exposure with AA mask;
11. Perform nitride etch and pad oxide etch, followed by 1st silicon trench etch to certain depth (~1000 Angstroms);
12. Switch etching chemistry to do oxide etch so as to remove all of the oxide inside the cell array area;
13. Switch etching chemistry again back to silicon trench etch to etch silicon both inside and outside cell array;
14. Complete the trench etch with proper bottom corner rounding, such that the trench depth in peripheral is deeper than cell array, e.g. 3700 Angstroms versus 2700 Angstroms;
15. Remove the photo resist and clean the wafer.
16. Form shallow trench isolation (STI) liner oxide;
17. Form isolation material with gap fill in the trenches (and use reverse active mask etch;
18. Perform chemical mechanical polishing to planarize the oxide and nitride regions;
19. Remove the nitride and the pad oxide in both cell and peripheral active area (It is desired to have the thicker sacrificial oxide in cell array with faster wet removal rate than the thin pad oxide in peripheral area as the former oxide has gone through cell Vt implant);
20. Perform other steps for Flash memory device; and
21. Perform other steps, as desired.

The above sequence of steps is a method according to an embodiment of the present invention. As shown, the method provides a method for forming a flash memory device structure using a method for forming trench isolation structures for improved device integration according to a specific embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 9 are simplified diagrams of a method for fabricating a Flash memory device according to an embodiment of the present invention. These diagrams are merely examples, which should not unduly limit the scope of the claims herein. One of ordinary skill in the art would recognize many variations, modifications, and alternatives. As shown, the present invention provides a method for fabricating a Flash memory according to an embodiment of the present invention. As shown, the method begins by providing a semiconductor substrate 101, e.g., silicon, silicon on insulator, epitaxial silicon. The substrate has at least a cell region 103 and a peripheral region 101. The method includes forming a dielectric layer overlying the cell region and the peripheral region. In a preferred embodiment, the method grows a layer of pad oxide 105 (~100 Angstrons and less, or slightly more) on an entire silicon substrate. In a specific embodiment, the method includes forming a silicon nitride layer 107 overlying the pad oxide layer. In a preferred embodiment, the method deposits a layer of silicon nitride at a thickness of about 1500 Angstroms or less, or slightly more. As shown, the method forms a masking layer 109, which exposes the cell region. In a preferred embodiment, the method applies a photo resist layer and provides exposure with a cell Vt mask. The method removes via etching the nitride opened by cell Vt mask and forms the cell Vt implant according to a specific embodiment.

Figure 2:
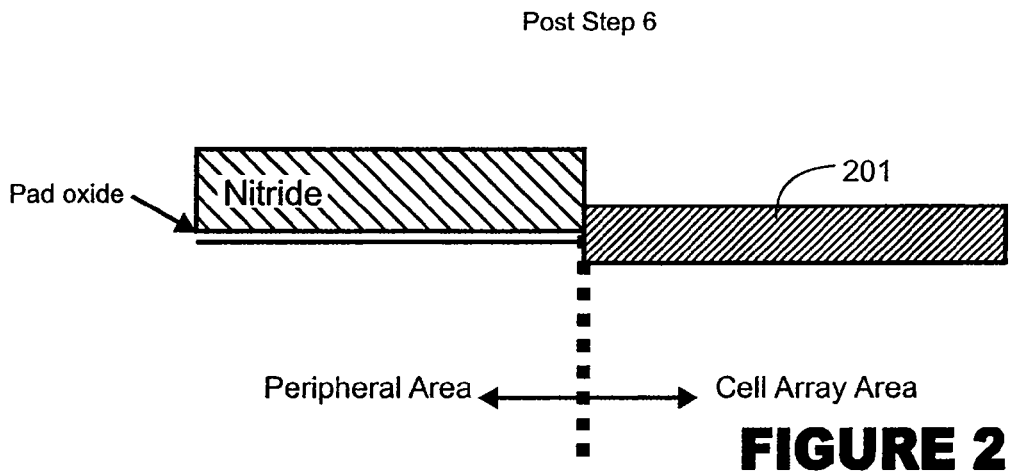

Referring now to FIG. 2, the method removes the photo resist and strips away the remaining pad oxide in the opened area, as shown. The photo resist is often removed by an ashing process or like process. The pad oxide is removed using a selective etching technique that removes the pad oxide to expose a bare silicon surface according to a specific embodiment. The method forms a thick layer of sacrificial material overlying the cell region according to a specific embodiment. In a preferred embodiment, the method uses a thermal technique to grow a layer of thick sacrificial oxide (~500 Angstroms) in the opened area, while other the areas are protected by the nitride layer. That is, the other area includes at least the peripheral region, as shown.

Figure 3:
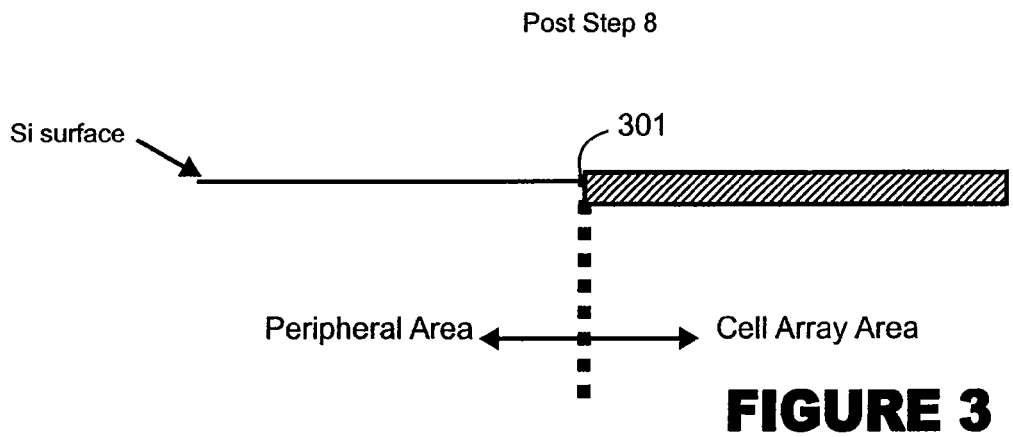

Referring to FIG. 3, the method removes the remaining nitride and pad oxide layer and cause the surface of the silicon outside the cell array to be at same level 301 as the oxide surface inside the cell array. In a specific embodiment, the present method of removing the nitride layer uses a dry etching technique that selectively removes the nitride and pad layer. Of course, there can be other variations, modifications, and alternatives.

Figure 4:
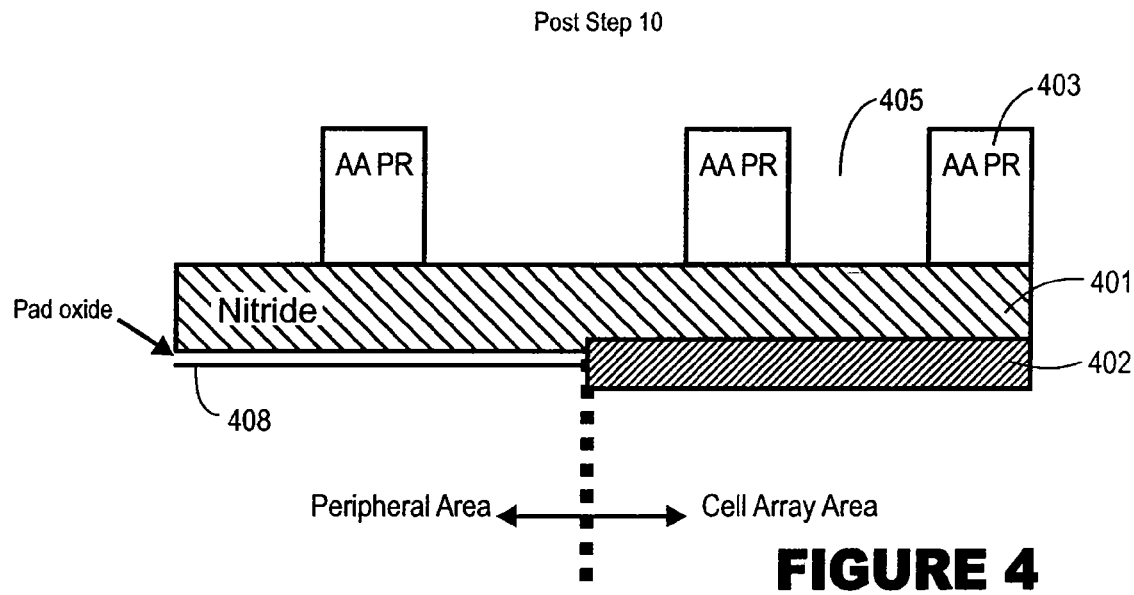

In a specific embodiment, the method includes forming a pad oxide layer and an overlying nitride layer, which serves as a masking layer. Referring to FIG. 4, the method grows a layer of pad oxide 408 (~100 Angstroms and less, or slightly more) again followed by depositing a layer of nitride 401 (~1500 Angstroms) according to a specific embodiment. In a specific embodiment, the method applies a photo resist 403 (with suitable anti-reflective coating if necessary) and provide exposure with AA mask, as shown. Exposed regions 405 are illustrated. As also shown, region 402 is thicker than region 408 according to a preferred embodiment. Of course, there can be other variations, modifications, and alternatives.

Figure 5:
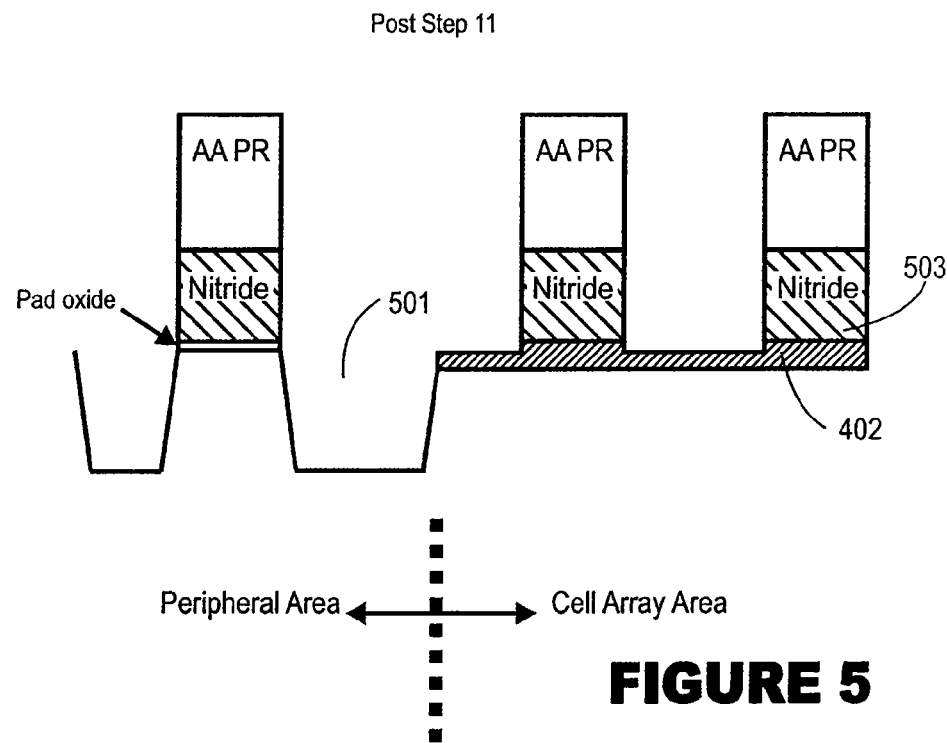

The method includes performing an etching step to pattern the nitride layer, which now serves as a masking material 503 according to a specific embodiment, as illustrated by FIG. 5. The method performs nitride etch and pad oxide etch, followed by 1st silicon trench etch to a certain depth. In a specific embodiment, the depth can be about 1000 Angstroms and less, or slightly more. As shown, oxide layer 402 is maintained in the cell region, while trench regions 501 have been exposed, according to a specific embodiment.

Figure 6:
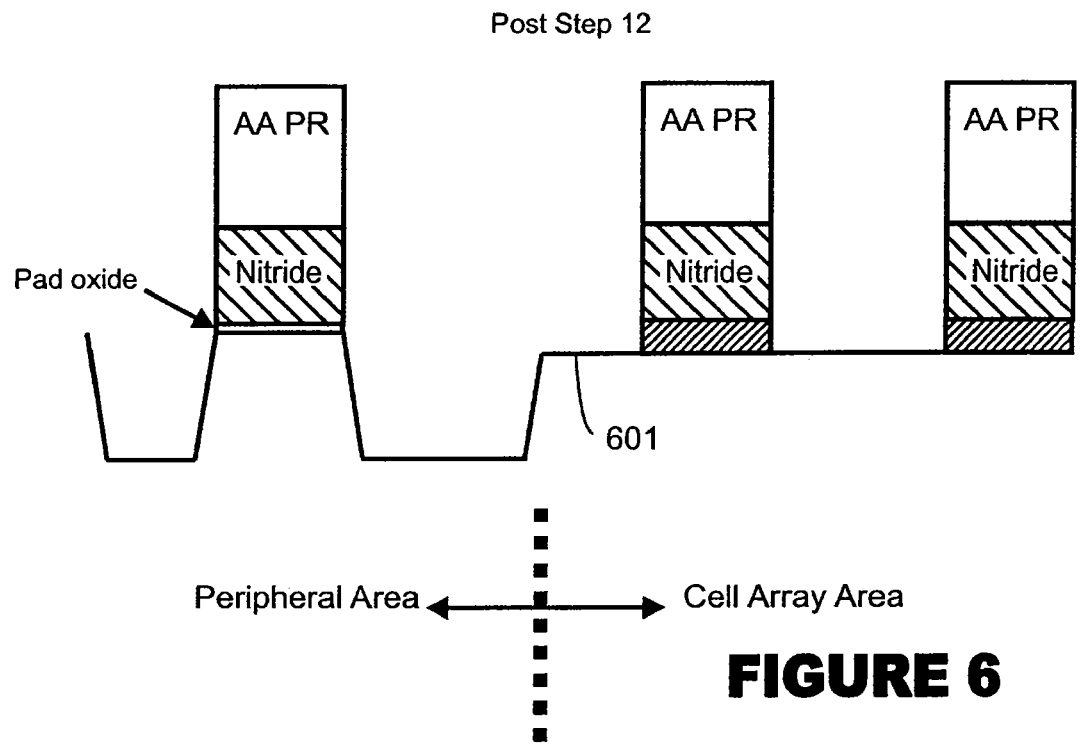

In a specific embodiment, the method removes exposed portions of the remaining oxide layer, as shown in FIG. 6. In a preferred embodiment, the method changes etching chemistry to perform an oxide etch to remove all and/or substantially all of the oxide inside the cell array area. Of course, there can be other variations, modifications, and alternatives.

Figure 7:
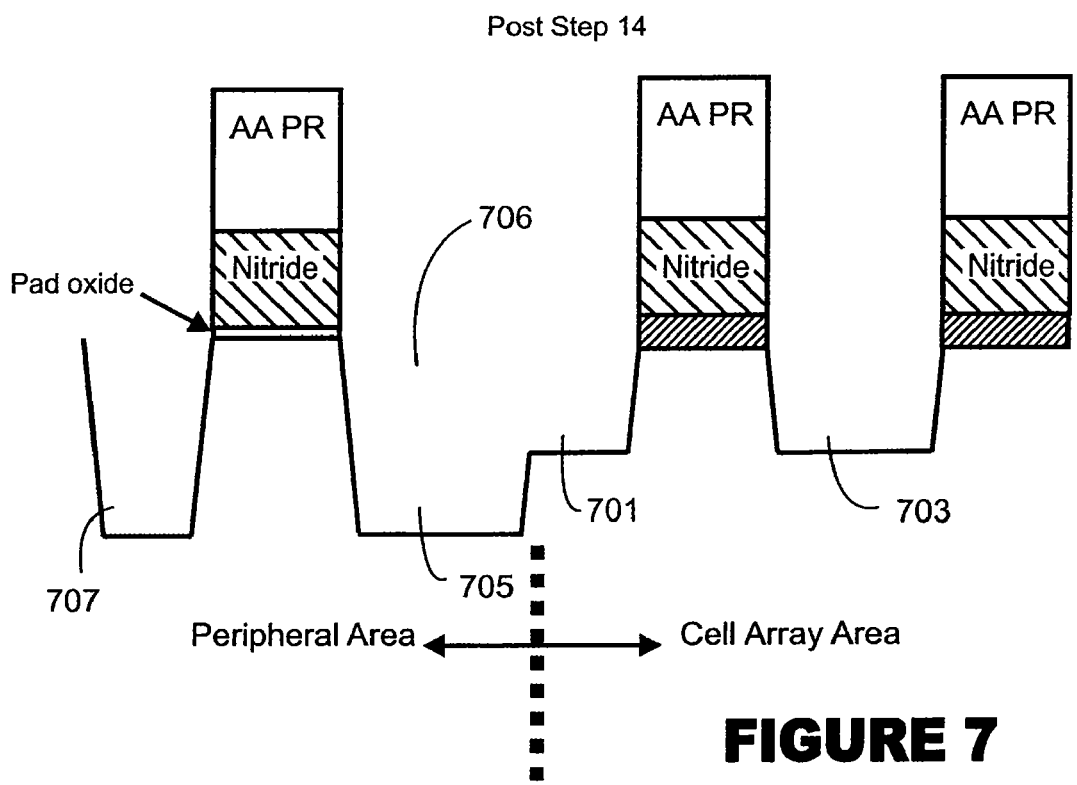

Referring to FIG. 7, the method performs an etching step to form trench regions on the exposed areas. That is, the method changes the etching chemistry again back to silicon trench etch to etch silicon both inside and outside cell array. In a specific embodiment, the method forms first trench regions, which have a first depth, second trench regions 706 including first 705 and second depths 701, and third trench regions with second depths 703. In a specific embodiment, the terms "first" "second" and "third" are not intended to be limiting but merely provided for explanation.

In a specific embodiment, the method completes the trench etch with a proper bottom corner rounding, such that the trench depth in the peripheral region is deeper than trench depth in the cell array region, e.g. 3700 Angstroms versus 2700 Angstroms. Additionally, the rounded regions have a radius of curvature of about 100 Angstroms and more according to a specific embodiment. In a specific embodiment, the method removes the photo resist and performs a cleaning process on the surfaces of the semiconductor substrate.

Figure 8:
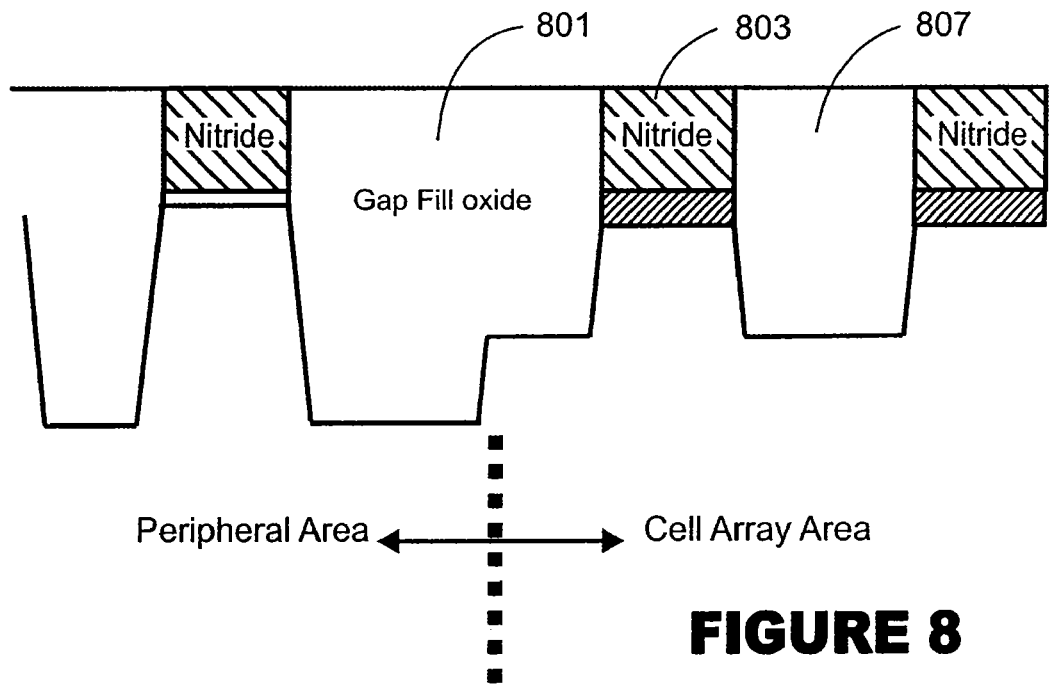
Figure 9:
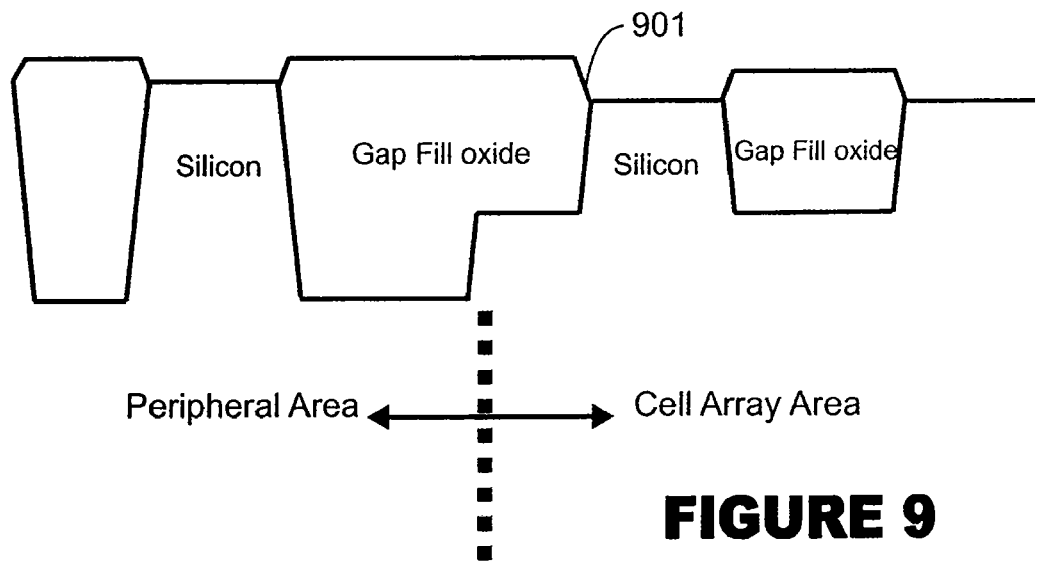

Referring to FIG. 8, the method forms isolating material in the trench regions. In a specific embodiment, the method forms a shallow trench isolation (STI) liner oxide and deposits a gap fill oxide material 801. The method also uses a reverse active mask etch and chemical mechanical polishing (CMP) process to planarize the regions of nitride 803 and oxide 807 on the semiconductor substrate according to a specific embodiment. In a specific embodiment, the reverse active mask can be opened on the cell region to improve STI CMP uniformity across the cell and peripheral area. The method removes the nitride and the pad oxide in both cell and peripheral active areas, as shown in FIG. 9. Depending upon the embodiment, it is desired to have a thicker sacrificial oxide in cell array with a faster wet removal rate than the thin pad oxide in peripheral area as the former oxide has gone through cell Vt implant, which causes impurities to be in the oxide layer. In a preferred embodiment, the faster etch rate can reduce the divot 901 formed at the STI corner in peripheral area due to longer wet etch time required to take away the thick sacrificial oxide in cell area. Of course, there can be other variations, modifications, and alternatives.

Figure 10:
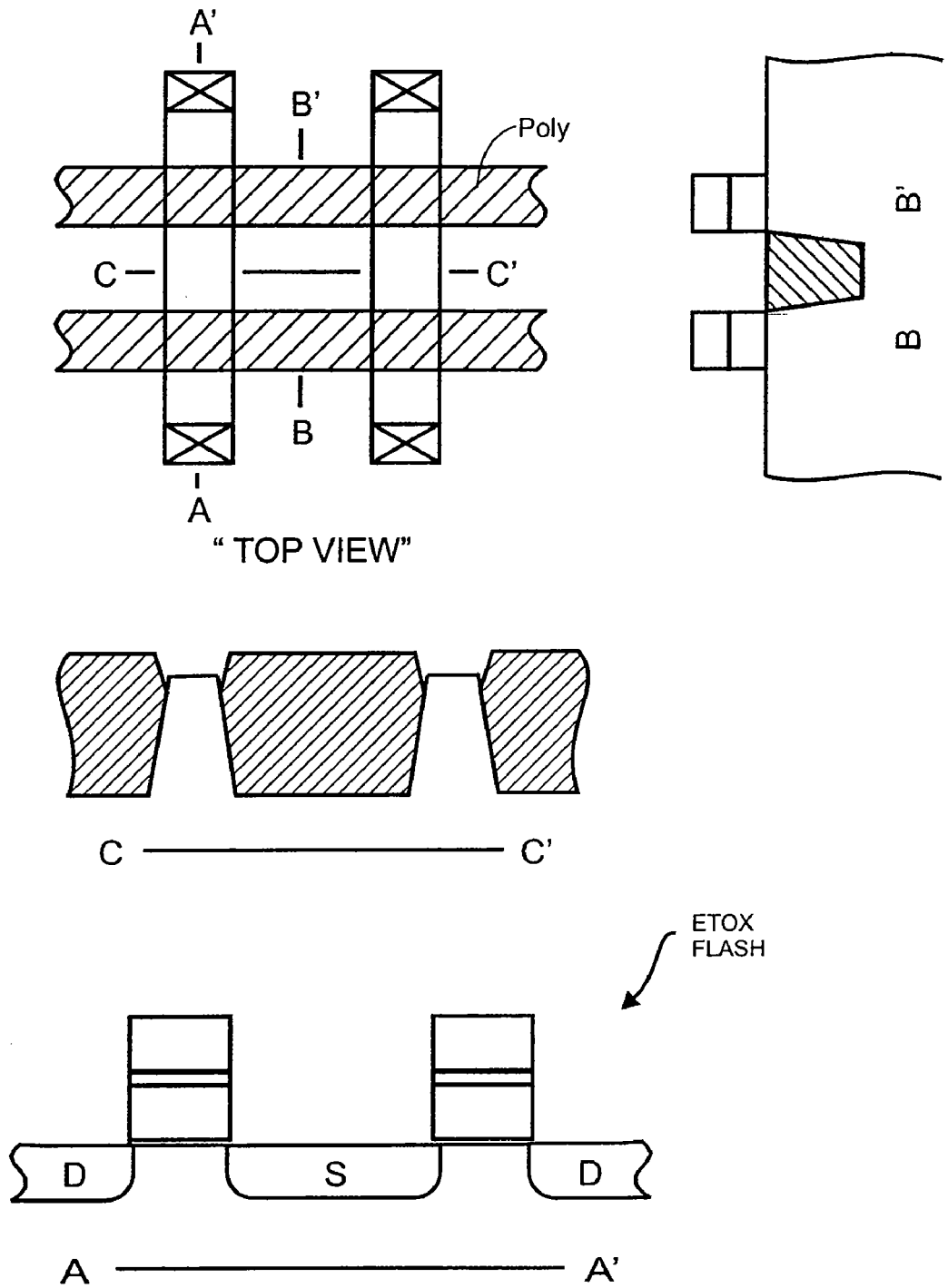
FIG. 10 is a simplified top and cross-sectional views of a Flash memory device according to an embodiment of the present invention.

In a specific embodiment, the method performs steps to form the Flash memory device. The Flash memory device is often an ETOX type device, but can be others. As merely an example, FIG. 10 illustrates a top and cross-sectional views of the Flash memory device according to an embodiment of the present invention.

The above sequence of steps is a method according to an embodiment of the present invention. As shown, the method provides a method for forming a flash memory device structure using a method for forming trench isolation structures for improved device integration according to a specific embodiment of the present invention. Other alternatives can also be provided where steps are added, one or more steps are removed, or one or more steps are provided in a different sequence without departing from the scope of the claims herein.

What is claimed is:

1. A method for fabricating integrated circuit devices, the method comprising:

providing a semiconductor substrate, the semiconductor substrate having a peripheral region and a cell region;

forming a first dielectric layer having a first thickness overlying a cell region and a second dielectric layer having a second thickness overlying the peripheral region;

forming a pad oxide layer overlying the first dielectric layer and the second dielectric layer;

forming a nitride layer overlying the pad oxide layer;

patterning at least the nitride layer to expose a first trench region in the peripheral region and to expose a second trench region in the cell region, while a portion of the first dielectric layer having the first thickness in the cell region is maintained;

forming a first trench structure having a first depth in the first trench region, while the portion of the first dielectric layer having the first thickness in the cell region protects the second trench region;

removing the portion of the first dielectric layer to expose the second trench region; and subjecting the first trench region, including the first trench structure, and the second trench region with an etching process to continue to form the first trench structure from the first depth to a second depth and to form a second trench structure having a third depth within the second trench region;

whereupon the third depth is less than the second depth.

2. The method of claim 1 wherein the first thickness is formed by forming an initial pad layer overlying the cell region, oxidizing the initial pad layer to increase a thickness of the initial pad layer.

3. The method of claim 1 further comprising removing the first dielectric layer having the second thickness in the peripheral region.

4. The method of claim 1 further comprising forming one or more Flash memory devices on the cell region.

5. The method of claim 1 wherein the third depth is 2000 to 4000 Angstroms.

6. The method of claim 1 wherein the second depth is 3000 to 5000 Angstroms.

7. The method of claim 1 wherein the nitride layer has a thickness of about 1000 to about 2000 Angstroms.

8. The method of claim 1 wherein the first thickness is at least 200 Angstroms.

9. The method of claim 1 wherein the second thickness is at least 100 Angstroms.

10. The method of claim 1 wherein the second trench structure has a width of about 0.2 micron and less.

11. The method of claim 1 further comprising filling the first trench structure and the second trench structure with a dielectric material.

12. The method of claim 11 further comprising removing the dielectric material in the second trench structure and implanting impurities within the second trench structure to form a self aligned source region.

* * * * *